(12) United States Patent
Huber et al.

(10) Patent No.: US 10,629,486 B2
(45) Date of Patent: Apr. 21, 2020

(54) METHOD FOR PRODUCING A PLURALITY OF SEMICONDUCTOR CHIPS AND SEMICONDUCTOR CHIP

(71) Applicant: OSRAM OLED GmbH, Regensburg (DE)

(72) Inventors: Michael Huber, Bad Abbach (DE); Lorenzo Zini, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/544,267

(22) PCT Filed: Jan. 11, 2016

(86) PCT No.: PCT/EP2016/050392
§ 371 (c)(1),
(2) Date: Jul. 18, 2017

(87) PCT Pub. No.: WO2016/116316
PCT Pub. Date: Jul. 28, 2016

(65) Prior Publication Data
US 2018/0012801 A1    Jan. 11, 2018

(30) Foreign Application Priority Data
Jan. 19, 2015    (DE) .................. 10 2015 100 686

(51) Int. Cl.
*H01L 21/78* (2006.01)
*H01L 33/44* (2010.01)
(Continued)

(52) U.S. Cl.
CPC .......... *H01L 21/78* (2013.01); *H01L 23/3171* (2013.01); *H01L 33/0095* (2013.01); *H01L 33/44* (2013.01)

(58) Field of Classification Search
CPC . H01L 21/78; H01L 23/3171; H01L 33/0095; H01L 33/44; H01L 33/005; H01L 21/76
See application file for complete search history.

(56) References Cited

U.S. PATENT DOCUMENTS 6,355,902 B2 *   3/2002   Akahori .................. C23C 16/26
                                                        219/121.43
2004/0198019 A1   10/2004   Yasui et al.
(Continued)

FOREIGN PATENT DOCUMENTS

CN          103889643 A      6/2014
DE    10 2011 015 725 A1    10/2012
(Continued)

OTHER PUBLICATIONS

International Search Report based on application No. PCT/EP2016/050392 (4 pages + 2 pages English translation) dated Mar. 8, 2016 (for reference purpose only).
(Continued)

*Primary Examiner* — Niki H Nguyen
*Assistant Examiner* — Juanita B Rhodes
(74) *Attorney, Agent, or Firm* — Viering, Jentschura & Partner mbB

(57) ABSTRACT

According to the present disclosure, a method for producing a plurality of semiconductor chips is provided with the following steps: a) providing a composite assembly, including a carrier, a semiconductor layer sequence and a functional layer; b) severing the functional layer by means of coherent radiation along a singulation pattern; c) forming separating trenches in the carrier along the singulation pattern; and d) applying a protective layer, which delimits the functional layer toward the separating trenches, on in each case at least one side surface of the semiconductor chips to be singulated. The singulated semiconductor chips
(Continued)

each includes a part of the semiconductor layer sequence, of the carrier and of the functional layer.

14 Claims, 5 Drawing Sheets

(51) Int. Cl.
  *H01L 33/00* (2010.01)
  *H01L 23/31* (2006.01)

(56) References Cited

U.S. PATENT DOCUMENTS

| | | |
|---|---|---|
| 2006/0205182 A1 | 9/2006 | Soejima |
| 2006/0211159 A1* | 9/2006 | Bruederl ............ H01L 21/76254 |
| | | 438/35 |
| 2010/0120228 A1* | 5/2010 | Saito .................. B23K 26/0604 |
| | | 438/463 |
| 2011/0215350 A1 | 9/2011 | Song et al. |
| 2012/0326178 A1 | 12/2012 | Fehrer et al. |
| 2013/0277756 A1 | 10/2013 | Kawano et al. |
| 2013/0307123 A1 | 11/2013 | Song |
| 2014/0080287 A1* | 3/2014 | Zull ........................ H01L 31/18 |
| | | 438/463 |
| 2014/0110374 A1 | 4/2014 | Brencher et al. |
| 2014/0141552 A1* | 5/2014 | Zou ..................... H01L 33/0079 |
| | | 438/28 |
| 2014/0213042 A1 | 7/2014 | Lei et al. |
| 2014/0248758 A1* | 9/2014 | Weiss ..................... B23K 26/38 |
| | | 438/463 |
| 2015/0255692 A1* | 9/2015 | Pfeuffer ................ H01L 33/405 |
| | | 438/27 |
| 2015/0318182 A1* | 11/2015 | Joseph ................ H01L 21/3086 |
| | | 438/714 |
| 2015/0333047 A1* | 11/2015 | Pfeuffer .............. H01L 25/0753 |
| | | 257/88 |
| 2016/0087177 A1* | 3/2016 | Schwarz ................. H01L 33/54 |
| | | 257/98 |

FOREIGN PATENT DOCUMENTS

| | | | |
|---|---|---|---|
| JP | 2004-179565 A | 6/2004 | |
| JP | 2004-311487 A | 11/2004 | |
| JP | 2006-253402 A | 9/2006 | |
| JP | 2008-300645 A | 12/2008 | |
| JP | 2011-187957 A | 9/2011 | |
| JP | 2013-058707 A | 3/2013 | |
| JP | 2013-514642 A | 4/2013 | |
| JP | 2013-206991 A | 10/2013 | |
| JP | 2013-222881 A | 10/2013 | |
| WO | WO-2014033041 A1 * | 3/2014 | |
| WO | WO 2014033041 A1 * | 3/2014 | ........... H01L 33/405 |
| WO | 2014095556 A1 | 6/2014 | |
| WO | WO 2014095556 A1 * | 6/2014 | ......... H01L 25/0753 |
| WO | WO-2014095556 A1 * | 6/2014 | |
| WO | WO-2014180772 A1 * | 11/2014 | |
| WO | WO 2014180772 A1 * | 11/2014 | ........... H01L 33/486 |

OTHER PUBLICATIONS

German Search Report based on application No. 10 2015 100 686.3 (9 pages) dated Nov. 16, 2015 (for reference purpose only).
Office Action issued for Japanese counterpart application No. 2017-538220 (5 pages), dated Jul. 17, 2018, including English Translation (7 pages) (for reference purpose only).
Japanese Office Action based on 2017-538220 (5 pages) dated Jul. 17, 2018 + English Translation (7 pages) (for reference purpose only).
Chinese Office Action based on 201680006363.3 (8 pages) dated Jul. 3, 2018 (for reference purpose only).

* cited by examiner

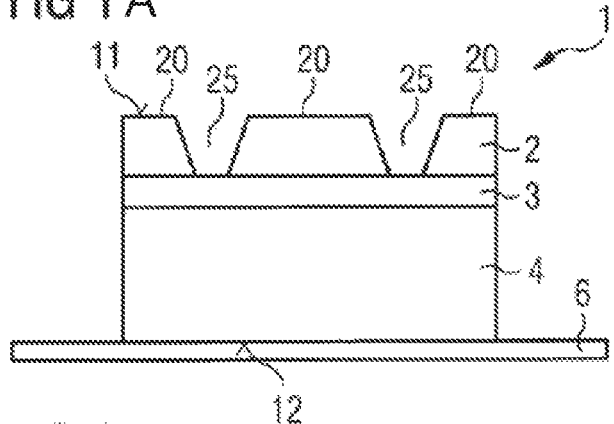
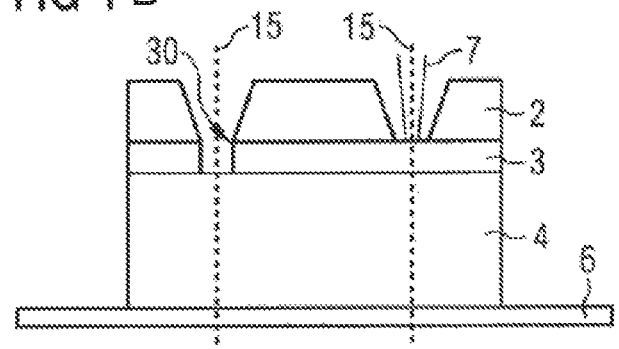
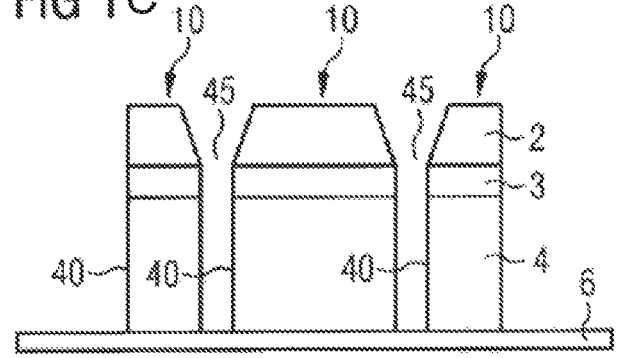
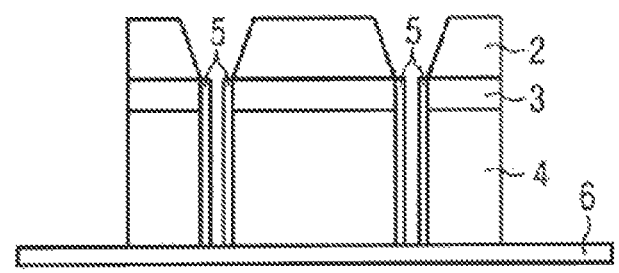

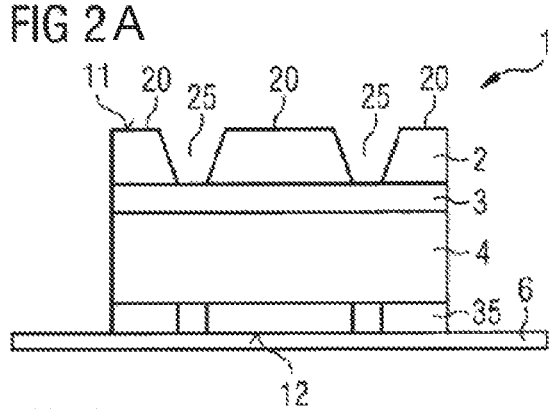
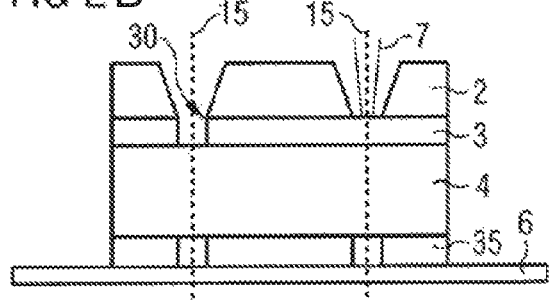
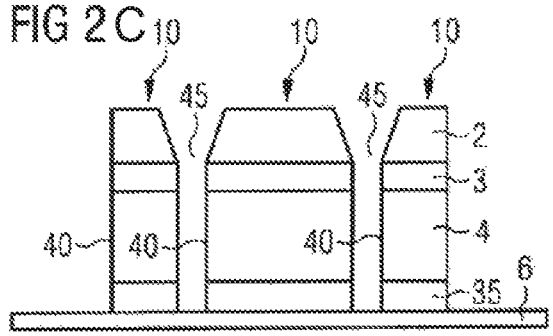
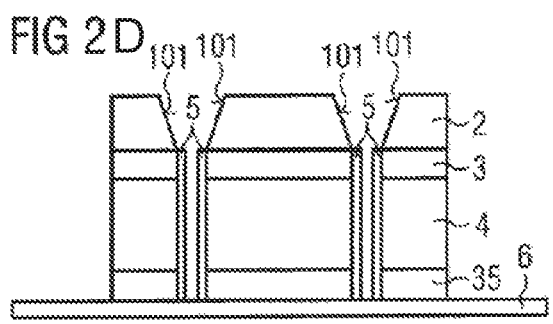

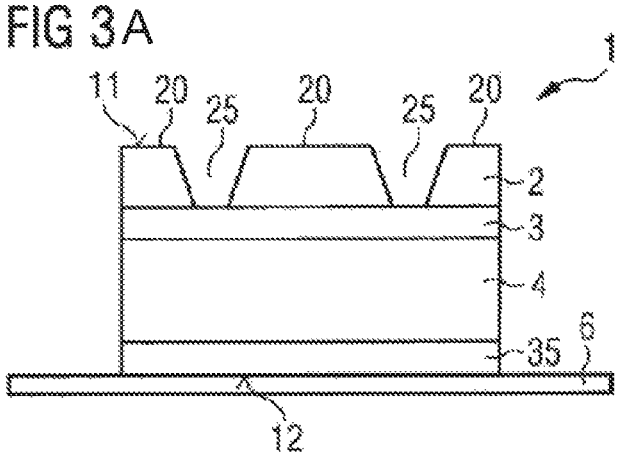
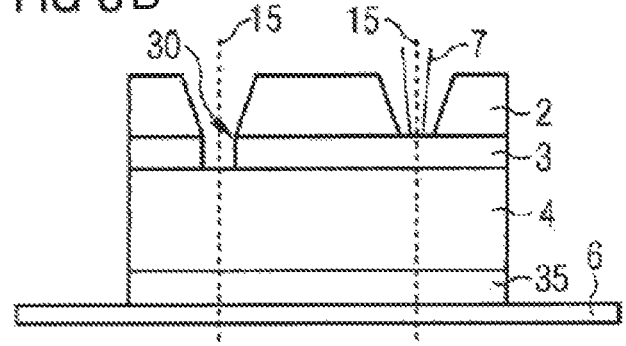
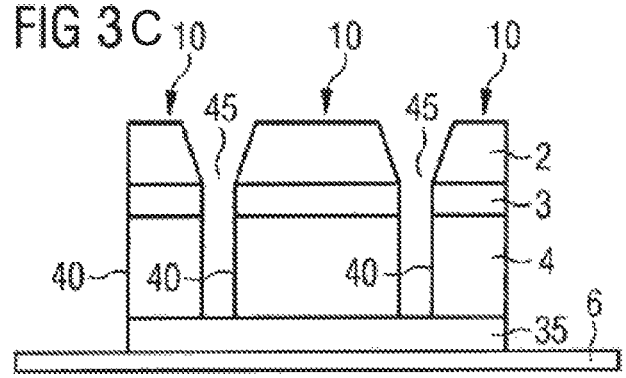
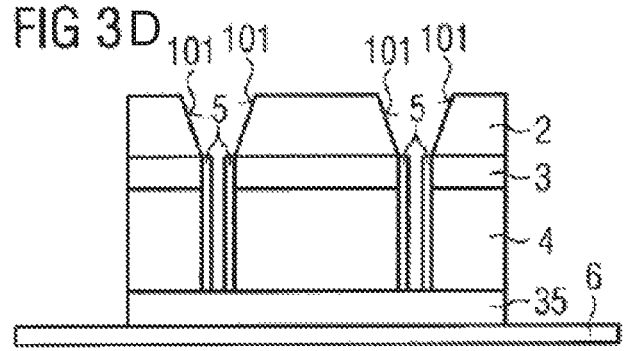

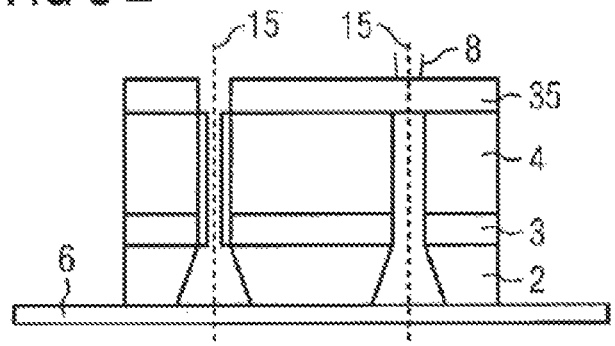
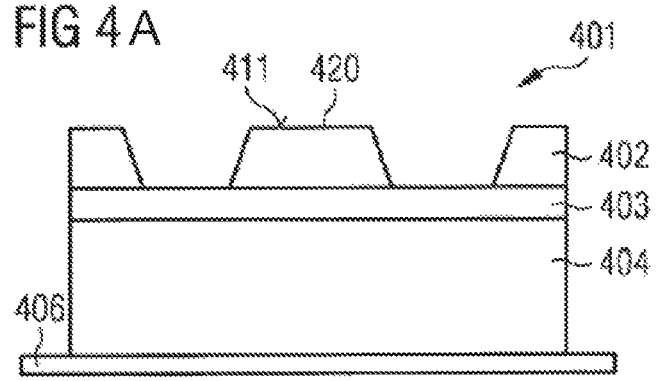
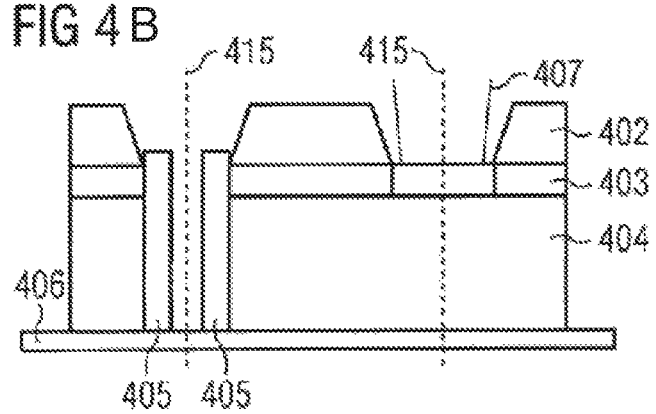

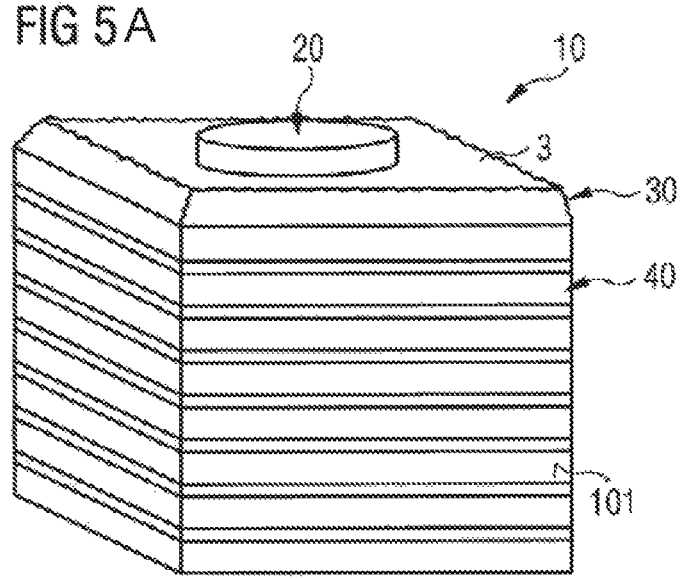
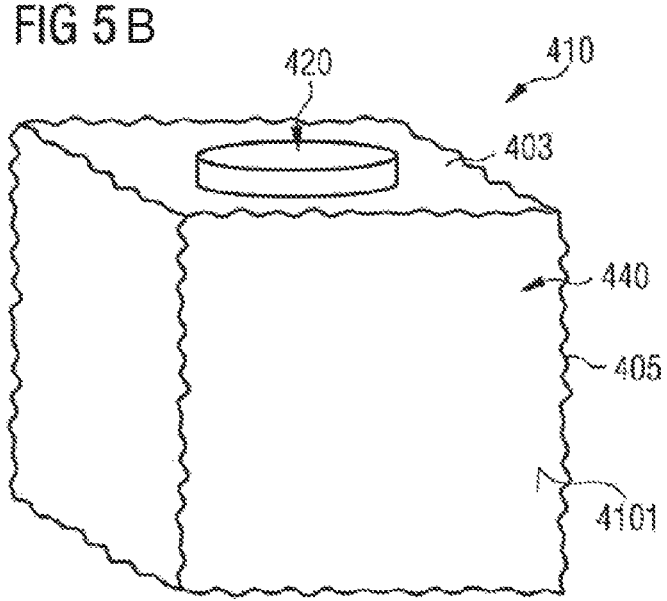

METHOD FOR PRODUCING A PLURALITY OF SEMICONDUCTOR CHIPS AND SEMICONDUCTOR CHIP

RELATED APPLICATIONS

The present application is a national stage entry according to 35 U.S.C. § 371 of PCT application No.: PCT/EP2016/050392 filed on Jan. 11, 2016, which claims priority from German application No.: 10 2015 100 686.3 filed on Jan. 19, 2015, and is incorporated herein by reference in its entirety.

TECHNICAL FIELD

A method for producing a plurality of semiconductor chips and a semiconductor chip are specified.

BACKGROUND

For producing a plurality of semiconductor chips from semiconductor wafers, in particular for singulating the semiconductor wafers into semiconductor chips, various methods can be employed which sever in particular the substrate material. However, the efficiency of most singulation methods is greatly dependent on the material to be severed.

SUMMARY

It is an object to specify a method which makes a contribution to producing a semiconductor chip simply and efficiently, and to enabling operation thereof that is reliable over a long lifetime.

In accordance with a first aspect of the present application, a method for producing a plurality of semiconductor chips is specified. The semiconductor chips can be in particular optoelectronic semiconductor chips, such as light emitting diode chips or photodiode chips, for example.

In at least one embodiment in accordance with the first aspect, a composite assembly is provided. The composite assembly extends in a vertical direction between a first main surface and a second main surface of the composite assembly, wherein the vertical direction can run perpendicularly to the first and/or second main surface. The main surfaces can be for example the top surface and the bottom surface of the composite assembly. The method relates in particular to a singulation of the composite assembly into a plurality of semiconductor chips along a singulation pattern. The singulation is effected in particular transversely with respect to the first and/or second main surface, for example in the vertical direction.

By way of example, the singulation pattern can be formed in a lattice-shaped fashion in the manner of a regular polygonal lattice. In this case, the singulation need not necessarily be effected along lines running straight. Rather, the singulation can also give rise to semiconductor chips whose side surfaces that arise in the course of singulation are curved at least regionally or have at least one bend.

In at least one embodiment in accordance with the first aspect, the composite assembly includes a carrier. The carrier contains for example a semiconductor material, for instance silicon, germanium, gallium phosphide or gallium arsenide, or consists of such a material. The carrier can be formed in an electrically conductive fashion or in an electrically insulating fashion.

In at least one embodiment in accordance with the first aspect, the composite assembly includes a semiconductor layer sequence. The semiconductor layer sequence is deposited for example epitaxially, for instance by means of sputtering, MOVPE, MOCVD or MBE. The semiconductor layer sequence can be deposited on the carrier or on a growth substrate that is different than the carrier. By way of example, the semiconductor layer sequence contains an active region provided for generating radiation and/or for receiving radiation.

By way of example, the semiconductor layer sequence, in particular the active region, contains a III-V compound semiconductor material. III V compound semiconductor materials are particularly suitable for generating radiation in the ultraviolet ($Al_x In_y Ga_{1-x-y} N$) through the visible ($Al_x In_y Ga_{1-x-y} N$, in particular for blue to green radiation, or $Al_x In_y Ga_{1-x-y} P$, in particular for yellow to red radiation) to the infrared ($Al_x In_y Ga_{1-x-y} As$) spectral range. It holds true here that in each case $0 \leq x \leq 1$, $0 \leq y \leq 1$ and $x+y \leq 1$, in particular where $x \neq 1$, $y \neq 1$, $x \neq 0$ and/or $y \neq 0$. With III-V compound semiconductor materials, in particular from the material systems mentioned, high internal quantum efficiencies can furthermore be achieved when generating radiation.

The first main surface is situated in particular on that side of the semiconductor layer sequence which faces away from the carrier. Correspondingly, the second main surface is situated in particular on that side of the carrier which faces away from the semiconductor layer sequence.

In at least one embodiment in accordance with the first aspect, the composite assembly includes a functional layer. The functional layer can be formed in a monolayer fashion or in a multilayer fashion. The functional layer may include a metallic layer and/or a dielectric layer.

By way of example, the functional layer or a partial layer thereof is electrically conductively connected to the semiconductor layer sequence.

Furthermore, it is possible for the functional layer or a partial layer thereof to be in direct contact with the semiconductor layer sequence and/or the carrier.

The functional layer or a partial layer thereof can furthermore be formed as a mirror layer for the radiation to be generated or to be detected in the semiconductor layer sequence. By way of example, the reflectivity for said radiation is at least 60%.

The functional layer or a partial layer thereof can furthermore be formed as a connection layer for a cohesive connection, for instance between the semiconductor layer sequence and the carrier. In this context, the functional layer includes for example a solder or an adhesive.

The singulated semiconductor chips in particular each include a part of the semiconductor layer sequence, of the carrier and of the functional layer.

In at least one embodiment in accordance with the first aspect, the functional layer is severed by means of coherent radiation, in particular along the singulation pattern. A suitable radiation source is, for example, a laser in pulsed operation, in particular with a pulse duration of at most 100 ps, advantageously at most 10 ps. Such short laser pulses are distinguished by a particularly low material selectivity. The material removal is thus effected largely independently of the material of the functional layer or individual partial layers of the functional layer. Furthermore, in this context, a power output of the radiation source, owing to the short pulse duration, and, in a manner corresponding thereto, a thermal loading of the semiconductor chips to be singulated, in particular of the functional layer, can be kept low.

In at least one embodiment in accordance with the first aspect, mesa trenches are already formed in the semiconductor layer sequence during the process of severing the functional layer. The mesa trenches define the individual semiconductor bodies that emerge from the semiconductor layer sequence. By way of example, the mesa trenches extend completely through the semiconductor layer sequence. In other words, the semiconductor layer sequence is already severed during the process of severing the functional layer. The singulation pattern thus runs along the mesa trenches in a plan view of the composite assembly. The functional layer is correspondingly severed along the mesa trenches.

In at least one alternative embodiment in accordance with the first aspect, the semiconductor layer sequence is also at least partly severed during the process of severing the functional layer.

In at least one embodiment in accordance with the first aspect, the carrier is also at least partly severed during the process of severing the functional layer. In this regard, by way of example, the individual carrier bodies of the semiconductor chips to be singulated are defined during the process of severing the functional layer. By way of example, for this purpose, on a side of the carrier facing the functional layer, cutouts are formed along the singulation pattern. In other words, the carrier is thus incipiently scribed.

In at least one embodiment in accordance with the first aspect, separating trenches are formed in the carrier, in particular along the singulation pattern. Forming the separating trenches can be carried out before or after severing the functional layer. The separating trenches can be formed for example by means of a chemical method. In the singulated semiconductor chips, the side surfaces of the separating trenches form in particular the side surfaces delimiting the semiconductor chip in a lateral direction.

A lateral direction is understood to mean a direction running along a main extension plane of the semiconductor layers of the semiconductor layer sequence. The lateral directions can run for example parallel to the first and/or second main surface.

In at least one embodiment in accordance with the first aspect, a protective layer is applied on at least one side surface of the respective semiconductor chips to be singulated. The protective layer delimits in particular the functional layer toward the separating trenches. Applying the protective layer is carried out after severing the functional layer. By way of example, the protective layer can be applied to semiconductor chips that have already been singulated, or to a composite assembly of semiconductor chips with a severed functional layer.

The protective layer serves in particular for encapsulating the semiconductor chip, thus making a contribution to protecting the respective side surface of the semiconductor chip against external influencing factors such as moisture or harmful gases. Furthermore, during later encapsulation of the singulated semiconductor chip with epoxy material, for example, by injection molding, so-called "mold chip in frame", it is thus possible to avoid a reaction with the side surface of the semiconductor chip, in particular the functional layer.

The protective layer can be applied for example in the context of forming the separating trenches. By way of example, the protective layer is a passivation layer used in the chemical method. The protective layer can for example contain one of the following materials, consist of one of the following materials, or emerge from a reaction with one of the following materials: octafluorocyclobutane, tetrafluoromethane, silicon dioxide, tantalum pentoxide, aluminum oxide, silicon nitride, titanium(IV) oxide.

In at least one embodiment in accordance with the first aspect, a composite assembly including a carrier, a semiconductor layer sequence and a functional layer is provided. The functional layer is severed by means of coherent radiation along a singulation pattern. Separating trenches are formed in the carrier along the singulation pattern. A protective layer, which delimits the functional layer toward the separating trenches, is applied on in each case at least one side surface of the semiconductor chips to be singulated. The semiconductor chips singulated from the composite assembly each include a part of the semiconductor layer sequence, of the carrier and of the functional layer.

As a result of material removal by means of coherent radiation, traces of a material removal by means of coherent radiation arise regionally on the side surfaces of semiconductor chips that arise in the course in singulation.

By virtue of the method described, the carrier can be severed simply and efficiently, in particular by means of a chemical method. By contrast, a functional layer which is arranged on the carrier in particular also in the region of the singulation pattern and which would not be removed, or would be removed only very slowly, by a chemical method is removed by means of coherent radiation before or after the process of forming the separating trenches.

The side surfaces of the respective semiconductor chips that are exposed in the course of severing the functional layer by means of coherent radiation are protected against external influences by applying the protective layer. This advantageously contributes to a function of the individual semiconductor chips that is reliable over a long lifetime. Furthermore, a material of a partial layer of the functional layer that is particularly sensitive to external influences, such as silver, for example, by virtue of the protective layer, can be arranged within the functional layer substantially independently of external influences, such that a variable arrangement of partial layers of the functional layer, in particular in a lateral direction, is made possible.

With the described method in accordance with the first aspect, it is first possible in particular to combine the high removal rate for semiconductor material in a chemical method such as a plasma separating method with the broad usability of a radiation-induced material removal for various materials of a functional layer, and at the same time to enable a function of the singulated semiconductor chips over a long lifetime.

With available installation systems, the method steps of the method in accordance with the first aspect can easily be automated, for example by means of semiconductor cassettes for receiving one or a plurality of composite assemblies, and an apparatus for the automated transporting of the semiconductor cassettes, positioning of a respective composite assembly and performance of the method steps of the method (so-called "cassette-to-cassette" systems).

In at least one embodiment in accordance with the first aspect, the functional layer includes a metallic layer and/or a dielectric layer. It is possible here for the functional layer to consist of at least one metal or to consist of at least one dielectric material. Furthermore, it is possible for the functional layer to be formed from a combination of metallic and dielectric layers.

In at least one embodiment in accordance with the first aspect, the carrier contains a semiconductor material. It is possible here for the carrier to consist of a semiconductor material.

In particular, the described method in accordance with the first aspect is particularly suitable for a construction of the composite assembly in which the functional layer includes a metallic layer and/or a dielectric layer, and the carrier contains a semiconductor material. With the method used, a particularly efficient and precise material removal is made possible on account of the use of different separating methods for different regions of the composite assembly, including with said combination of materials. In particular, in this context, in comparison with a single-stage singulation method by means of laser radiation with pulse durations in the nanoseconds range, a higher yield of singulated semiconductor chips and/or a larger active area of the semiconductor bodies can result, since melting of the side surfaces of the singulated semiconductor chips can be avoided to the greatest possible extent.

In at least one embodiment in accordance with the first aspect, the functional layer is arranged between the semiconductor layer sequence and the carrier. By way of example, the functional layer contains a connection layer used to secure the semiconductor layer sequence on the carrier, for instance a solder layer. In a departure therefrom, however, the functional layer can also be arranged on that side of the carrier which faces away from the semiconductor layer sequence, or on that side of the semiconductor layer sequence which faces away from the carrier.

In at least one embodiment in accordance with the first aspect, the functional layer extends over the whole area of the composite assembly before the process of severing the composite assembly by means of coherent radiation. The functional layer can thus be totally unstructured in a lateral direction. In the case where the separating trenches are formed before the process of severing the functional layer, adjacent semiconductor chips after the process of forming the separating trenches in the carrier, for example, can be mechanically connected to one another in each case via the functional layer.

In at least one embodiment in accordance with the first aspect, the separating trenches are formed by means of a chemical method. In particular, the trenches are formed by means of a plasma separating method, for example by means of an ICP (Inductively Coupled Plasma) method or by means of deep reactive ion etching (DRIE). This method is also referred to as the "Bosch process". Plasma separating methods may be distinguished by high etching rates particularly in semiconductor material. In particular, the chemical method is a multistage etching process including both etching and passivating steps. Forming the separating trenches is effected in particular anisotropically in a vertical direction, such that a material removal in a lateral direction is kept small and an efficient severing of the carrier is made possible.

In at least one embodiment in accordance with the first aspect, the protective layer is a passivation layer of the chemical method. The chemical method includes for example alternating etching and passivating steps which make it possible to form the separating trenches anisotropically in a vertical direction. In this case, a passivating step includes applying a passivation layer, which covers in particular the side surfaces of the semiconductor chips and protects them from an etching reaction or a chemical material removal in a later etching step. When a predefined depth of the separating trenches is attained, particularly if the separating trenches extend completely through the carrier, the chemical method is ended with a passivating step. Advantageously, in the case where the functional layer has already been severed along the singulation pattern, the functional layer on the side surfaces of the semiconductor chips is covered by the passivation layer. Such a procedure enables simple and reliable encapsulation of the individual semiconductor chips without additional method steps.

In at least one embodiment in accordance with the first aspect, the protective layer contains at least one of the following materials or consists of one of the following materials: octafluorocyclobutane, tetrafluoromethane, silicon dioxide, tantalum pentoxide, aluminum oxide, silicon nitride, titanium(IV) oxide. Additionally and/or alternatively, the protective layer can emerge for example from a reaction with one of the materials mentioned above.

In at least one embodiment in accordance with the first aspect, the separating trenches extend completely through the carrier. By way of example, after the process of forming the separating trenches, the composite assembly is held together only via the functional layer.

In at least one embodiment in accordance with the first aspect, forming the separating trenches is carried out after severing the functional layer. By way of example, firstly the functional layer arranged between the semiconductor layer sequence and the carrier is severed by means of coherent radiation and afterward the carrier is severed by means of a plasma separating method. In particular, a passivation layer applied in the context of forming the separating trenches can thus be used as a protective layer for the functional layer. The functional layer that has already been severed can furthermore serve as a mask for the process of forming the separating trenches. The separating trenches arise in particular in a self-aligning fashion in the regions in which the functional layer has been removed. In a lateral direction, the functional layer and the carrier body that arises in the course of singulation can terminate flush. In a departure therefrom, however, an additional mask or mask layer can also be provided.

In at least one embodiment in accordance with the first aspect, applying the protective layer is carried after forming the separating trenches. Advantageously, the protective layer can be applied in the context of a chemical method used for forming the separating trenches. In particular, in this context, forming the separating trenches and applying the protective layer can take place in the same process chamber. In this way, the side surfaces produced by the separation are not contaminated with dust, for example, in the event of changing to a different process chamber.

In at least one embodiment in accordance with the first aspect, the composite assembly includes a further functional layer. In particular, the functional layer and the further functional layer are spaced apart from one another in a vertical direction. By way of example, the functional layer and the further functional layer are arranged on opposite sides of the carrier. The further functional layer can be embodied in particular as described in association with the functional layer. Severing of the further functional layer can be effected for example by means of coherent radiation or mechanical loading, for example by means of an action of pressure on the composite assembly in a direction running obliquely or perpendicularly to the main surfaces of the composite assembly.

Before singulation, both the functional layer and the further functional layer can be totally unstructured in a lateral direction and totally cover in particular the carrier along the singulation pattern. In the course of singulation, the functional layer and the further functional layer can be severed along the singulation pattern, wherein forming the separating trenches is carried out for example between severing the functional layer and severing the further functional layer.

In at least one embodiment in accordance with the first aspect, the composite assembly is secured on an auxiliary carrier before singulation, in particular before forming the separating trenches and/or before severing the functional layer. A suitable auxiliary carrier is, for example, a film, a rigid carrier or a plate, in the case of which the semiconductor chips which are still situated in the composite assembly or the semiconductor chips which have already been singulated are held by suction by means of reduced pressure or are fixed by means of electrostatic forces. After singulation, the semiconductor chips can be present on the auxiliary carrier in a geometrical order, for example in a matrix-shaped structure. The further processing of the semiconductor chips is thereby simplified.

In accordance with a second aspect of the present application, a semiconductor chip is specified. The semiconductor chip is producible in particular by a method described here, such that all features disclosed for the method are also disclosed for the semiconductor chip, and vice versa.

In at least one embodiment in accordance with the second aspect, the semiconductor chip includes a semiconductor body, a carrier body, and a functional layer, which are arranged one on top of another in a vertical direction, and also a protective layer, arranged on at least one side surface of the semiconductor chip. The functional layer on at least one side surface of the semiconductor chip has traces of a material removal by means of coherent radiation. For producing such a semiconductor chip, it is possible to dispense with structuring the functional layer before severing by means of coherent radiation. The feature according to which the functional layer on a side surface of the semiconductor chip has traces of a material removal by means of coherent radiation is a substantive feature which can be demonstrated unambiguously on the finished semiconductor chip using analysis methods of semiconductor technology. By way of example, said traces can be differentiated unambiguously from traces which can be produced by sawing, breaking, etching or other separating techniques. The feature mentioned is thus in particular not a method features.

In at least one embodiment in accordance with the second aspect, the carrier body on at least one side surface of the semiconductor chip has traces of a chemical material removal. This is likewise a substantive feature which can be demonstrated unambiguously on the finished semiconductor chip using analysis methods of semiconductor technology.

In at least one embodiment in accordance with the second aspect, the functional layer on the at least one side surface of the semiconductor chip which has the traces is covered by the protective layer. The protective layer contributes in particular to protecting the functional layer against external influencing factors such as moisture or harmful gases. This advantageously contributes to a function of the individual semiconductor chips that is reliable over a long lifetime. The protective layer can for example contain one of the following materials or consist of one of the following materials: octafluorocyclobutane, tetrafluoromethane, silicon dioxide, tantalum pentoxide, aluminum oxide, silicon nitride, titanium(IV) oxide.

In at least one embodiment in accordance with the second aspect, the functional layer is arranged between the carrier body and the semiconductor body. The functional layer or a partial layer thereof can be formed for example as a connection layer for a cohesive connection between the semiconductor body and the carrier body. In the case of a cohesive connection, the, advantageously prefabricated, connection partners are held together by means of atomic and/or molecular forces. A cohesive connection can be achieved for example by means of a connection medium, for instance an adhesive or a solder. In general, separation of the connection is accompanied by destruction of the connection medium and/or of at least one of the connection partners. By way of example, the semiconductor chip is formed as a thin-film semiconductor chip in which a growth substrate for the semiconductor layer sequence of the semiconductor body is removed and the carrier body mechanically stabilizes the semiconductor body.

In at least one embodiment in accordance with the second aspect, the semiconductor chip includes a further functional layer, which is arranged on a side of the carrier body facing away from the semiconductor body. The further functional layer on at least one side surface of the semiconductor chip has for example traces of a material removal by means of coherent radiation, or a fracture edge on account of mechanical loading. The further functional layer can be formed for example as a carrier-side electrical contact for the external electrical contacting of the semiconductor chip.

BRIEF DESCRIPTION OF THE DRAWING(S)

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1A to 1D show a first embodiment of a method for producing a plurality of semiconductor chips on the basis of intermediate steps illustrated in each case in schematic sectional view;

FIGS. 2A to 2D show a second embodiment of a method for producing a plurality of semiconductor chips on the basis of intermediate steps illustrated in each case in schematic sectional view;

FIGS. 3A to 3E show a third embodiment of a method for producing a plurality of semiconductor chips on the basis of intermediate steps illustrated in each case in schematic sectional view;

FIGS. 4A and 4B show an alternative method for producing a plurality of semiconductor chips on the basis of intermediate steps illustrated in each case in schematic sectional view; and FIGS. 5A and 5B show a schematic illustration in each case of a singulated semiconductor chip.

DETAILED DESCRIPTION

Elements that are identical, of identical type or act identically are provided with the same reference signs in the figures. The figures and the size relationships of the elements illustrated in the figures among one another should not be regarded as to scale. Rather, individual elements and in particular layer thicknesses may be illustrated with exaggerated size in order to enable better illustration and/or in order to afford a better understanding.

A first embodiment of a method for producing a plurality of semiconductor chips is shown with reference to FIGS. 1A to 1D in each case in schematic sectional view. As illustrated in FIG. 1A, a composite assembly 1 is provided, which is provided for singulation into a plurality of semiconductor chips 10. By way of example, the semiconductor chips 10 are optoelectronic semiconductor chips, including an active region (not explicitly shown in the figures, for the sake of simplified illustration) provided for generating and/or for receiving radiation. In the embodiment illustrated in FIG. 1A, the composite assembly 1 includes a semiconductor layer sequence 2, which is subdivided into a plurality of semiconductor bodies 20 by means of mesa trenches 25. The semiconductor layer sequence 2 has for example a thickness of between 1 µm and 20 µm inclusive. In this embodiment, the semiconductor layer sequence 2 has in particular a thickness of between 7 µm and 8 µm inclusive. The semiconductor layer sequence 2, in particular the active region, contains for example one of the compound semiconductor materials mentioned in the general part of the description. The semiconductor layer sequence 2 is arranged on a carrier 4. The carrier 4 contains for example a semiconductor material, for instance silicon or germanium. A different semiconductor material such as gallium phosphide or gallium arsenide can also be employed.

A functional layer 3 is arranged between the semiconductor layer sequence 2 and the carrier 4. The functional layer 3 contains for example a connection layer used for securing the semiconductor layer sequence 2 cohesively on the carrier 4, for instance a solder layer or an electrically conductive adhesive layer. The functional layer 3 may furthermore include a partial layer provided as a metallic mirror layer for the radiation to be generated or to be absorbed in the semiconductor bodies 20. The functional layer 3 may for example furthermore include a layer for electrical contacting or for current spreading. By way of example, the mirror layer contains silver. Alternatively or supplementarily, the functional layer 3 may also include a dielectric layer.

The composite assembly 1 is formed for the production of thin-film semiconductor chips, in particular thin-film luminescence diode chips. A growth substrate for the epitaxial deposition of the semiconductor layer sequence 2 has already been removed in the stage shown in FIG. 1A. The carrier 4 mechanically stabilizes the semiconductor layer sequence.

In a vertical direction, the composite assembly 1 extends between a first main surface 11 and a second main surface 12. The first main surface 11 is formed by the semiconductor layer sequence 2. In a departure therefrom, however, one or a plurality of layers, for example a passivation layer and/or a layer for electrical contacting or for current spreading, can be arranged on the semiconductor layer sequence 2.

The composite assembly 1 is secured by the second main surface 12 on an auxiliary carrier 6. The auxiliary carrier 6 can be for example a film clamped onto a frame. Alternatively, the auxiliary carrier 6 can also be a rigid carrier or an apparatus in which the composite assembly 1 and in particular the semiconductor chips 10 singulated later are fixed by means of reduced pressure or by means of electrostatic forces. By means of the auxiliary carrier 6, the singulated semiconductor chips 10 can be present in a geometrical order, for example in a matrix-shaped fashion. The further processing is simplified as a result.

As illustrated in FIG. 1B, coherent radiation 7, for example laser radiation having pulse durations in the picoseconds range, is applied to the composite assembly 1 from the first main surface 11 along a singulation pattern 15. Advantageously, the coherent radiation 7 has a pulse duration of at most 100 ps, advantageously at most 10 ps.

The singulation pattern 15 may include for example a lattice structure having first singulation lines along a first direction and having second singulation lines running obliquely or perpendicularly to the first singulation lines. However, the singulation patterns 15 can also at least regionally run in a curved fashion or be formed such that the singulated semiconductor chips 10 in plan view have a basic shape having more than four corners, for example a hexagonal basic shape.

In this embodiment, the singulation pattern 15 runs along the mesa trenches 25. In a departure therefrom, it is also conceivable for the semiconductor layer sequence 2 and the functional layer 3 to be severed by means of coherent radiation 7 in a common fabrication step.

On account of the low material selectivity of the removal by means of coherent radiation 7, in particular in the case of lasers in pulsed operation in the picoseconds range, the severing of the functional layer 3 is effected largely independently of the material composition of the functional layer 3 or the partial layers thereof. Even fluctuations in the material composition that occur over the composite assembly 1 in a lateral direction, for example fluctuations in the alloy or solder constituents or in the phase distribution in the connection layer, do not lead to undesired inhomogeneous material removal of the functional layer 3. The material removal can be controlled by setting the parameters of the laser, in particular the wavelength, the pulse duration, the frequency and the pulse shape, and also by the further method parameters such as, in particular, the beam caustic curve, the beam geometry, the feed speed and the optical power.

When severing composite assemblies 1 which differ to a comparatively great extent in the composition of the functional layer 3, a simple adaptation of this laser ablation process can be rapidly adapted to the changed conditions without functional layer development outlay.

In a departure from the embodiment described, the composite assembly 1 can also be secured on the auxiliary carrier 6 only after the functional layer 3 has already been severed. Furthermore, it is also conceivable for the individual steps to be carried out on different auxiliary carriers. One or a plurality of affixing adhesive-bonding or transfer adhesive-bonding steps can be carried out for this purpose. An auxiliary carrier 6 embodied as a film can be expanded, if necessary, between two steps.

The composite assembly 1 with a partly severed functional layer 3 is likewise shown in FIG. 1B. Afterward, separating trenches 45 are formed in the carrier 4 along the singulation pattern 15. The semiconductor chips 10 singulated in this way, said semiconductor chips each including a semiconductor body 20 and a carrier body 40 emerging from the carrier 4, are shown in FIG. 1C.

Forming the separating trenches 45 is advantageously effected by means of a chemical method, in particular by means of a dry-chemical method such as a plasma separating method. By way of example, an ICP (inductively coupled plasma) separating method or deep reactive ion etching can be employed. With such a method, in particular semiconductor materials such as silicon and germanium can be removed with high removal rates. The resultant separating trenches 45 extend completely through the carrier 4 in a vertical direction, such that the semiconductor chips 10 are connected to one another only via the auxiliary carrier 6.

In this embodiment, therefore, firstly the functional layer 3 is removed by means of coherent radiation before the separating trenches 45 are formed from the same side of the composite assembly. In this case, the functional layer 3 can serve as mask for forming the separating trenches 45. A mask in the process of forming the separating trenches 45 can thus be dispensed with. In a departure therefrom, however, it is also conceivable for a mask or a mask layer to be provided on the further functional layer 3.

The separating method described combines the low material selectivity and the high removal rates achievable thereby for dielectric material and metallic material of a laser ablation method with the high removal rates of a chemical separating method, in particular a plasma method, for semiconductor materials. It has been found that such a two-stage method overall is distinguished by a particularly high reliability and by high throughput rates.

In particular, the method has particularly little sensitivity to process fluctuations in the upstream steps for producing the composite assembly 1, for example with regard to fluctuations in the layer thickness of the functional layer 3. Moreover, the method can be automated in a simplified manner, for example by a cassette-to-cassette process.

The method described is largely independent of the concrete configuration of the semiconductor chips 10 to be singulated from a composite assembly 1. By way of example, the semiconductor chips 10 can also have two front-side to two rear-side contacts. Furthermore, on the semiconductor layer sequence 2 or the semiconductor body 20 it is possible to arrange one or a plurality of further layers, for example a passivation layer, for instance an oxide layer or a nitride layer, and/or a layer containing a TCO (Transparent Conductive Oxide) material and/or a layer containing a phosphor provided for radiation conversion.

In this embodiment, the chemical method includes etching and passivating steps that are carried out alternately until the separating trenches 45 extend completely through the carrier 4. In this context, the composite assembly 1 can initially be covered with a protective lacquer (not illustrated), for example a polyvinyl alcohol layer, which protects in particular the semiconductor layer sequence 2 against the subsequent etching and passivating steps. The protective lacquer is applied in particular before the functional layer 3 is severed.

In a passivating step of the chemical method, a gas mixture including octafluorocyclobutane ($C_4F_8$) or tetrafluoromethane ($CF_4/H_2$), for example, is introduced in particular in the region of the separating trenches 45, said gas mixture, in a manner activated by plasma in the chemical method, forming a polymer passivation layer on the side surfaces of the separating trenches 45. Afterward, etching and passivating steps are carried out alternately.

When a predefined depth of the separating trenches 45 is attained, particularly if the separating trenches 45 extend completely through the carrier 4, a passivating step is carried out which is not followed by a further etching step. In this stage, the passivating layer applied last covers the side surfaces of the separating trenches 45, of the functional layer 3 and of the semiconductor layer sequence 2, and also the first main surface 11 of the composite assembly 1. By removing the protective lacquer, it is possible for the passivation layer to be removed in a targeted manner such that at least the functional layer 3 still remains completely covered by a part of the passivation layer as a protective layer 5. Consequently, no further method step is necessary for applying the protective layer 5.

In other embodiments, the protective layer 5 can alternatively be applied in a separate step. By way of example, a final encapsulation of the semiconductor chips 10 with a silicon dioxide layer ($SiO_2$) or a tantalum pentoxide layer ($Ta_2O_5$) is carried out. In this context, it is conceivable for one or a plurality of affixing adhesive-bonding or transfer adhesive-bonding steps to be carried out for this purpose. By way of example, the composite assembly 1 or the singulated semiconductor chips 10 on the auxiliary carrier 6 are fed to a separate installation for this purpose.

The second embodiment illustrated in FIGS. 2A to 2D and the third embodiment illustrated in FIGS. 3A to 3E differ from the first embodiment described in association with FIGS. 1A to 1D in particular in that the composite assembly 1 includes a further functional layer 35, which is arranged on a side of the carrier 4 facing away from the functional layer 3. The further functional layer 35 can be embodied as described in association with the functional layer 3. By way of example, the further functional layer 35 is formed as a carrier-side electrical contact for the external electrical contacting of the semiconductor chip 10.

In the second embodiment, the composite assembly 1 is provided including the further functional layer 35 already singulated along the singulation pattern 15 (FIG. 2A).

In the third embodiment, the composite assembly 1 is provided including the further functional layer 35 formed as a continuous layer (FIG. 3A). As shown in FIG. 3E, the further functional layer 35 is severed only after the application of the protective layer 5, in particular by means of coherent radiation or mechanical loading, such as by means of a liquid jet 8, for example.

In an alternative production method (FIGS. 4A and 4B), coherent radiation 407, for example laser radiation having pulse durations in the nanoseconds range, is applied to a composite assembly 401 from a first main surface 411 along a singulation pattern 415. In this case, a power output of the radiation source is so high that a partial region of the composite assembly 401 melts along the singulation pattern 415 to form a slag that forms a protective layer 405. The protective layer 405 contributes to a functional layer 403 being protected to the greatest possible extent against external influences such as moisture or harmful gases. In this case, the protective layer 405 can extend beyond the functional layer 403 in a vertical direction.

FIG. 5A shows a schematic illustration of a singulated semiconductor chip 10 produced for example by one of the methods described in the embodiments. The carrier body 40 has a grooved structure typical of a chemical material removal. The functional layer 3, a metal layer in this embodiment, exhibits the traces 30 typical of a material removal by means of coherent radiation 7.

FIG. 5B shows a schematic illustration of a singulated semiconductor chip 410 produced for example according to the method described in FIGS. 4A and 4B. The carrier body 440 has been coated on the side surface 4101 with the slag typical of material removal by means of coherent radiation 407 having pulse durations in the nanoseconds range, as a protective layer 405.

The present disclosure is not restricted by the description on the basis of the embodiments. Rather, the present disclosure encompasses any novel feature and also any combination of features, which in particular includes any combination of features in the patent claims, even if this feature or this combination itself is not explicitly specified in the patent claims or embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a plurality of semiconductor chips comprising:
   providing a composite assembly, comprising a carrier, a semiconductor layer sequence, and a functional layer;

severing the functional layer by means of coherent radiation along a singulation pattern;

applying a chemical method to the composite assembly along the singulation pattern to form separating trenches in the carrier; and wherein the coherent radiation also melts the composite assembly along the singulation pattern to form a protective layer comprising slag, which delimits the functional layer toward the separating trenches, on at least one side surface of each semiconductor chip to be singulated; wherein at least the functional layer remains covered by the protective layer;

wherein the singulated semiconductor chips each comprise a part of the semiconductor layer sequence, of the carrier and of the functional layer.

2. The method as claimed in claim 1,
wherein the functional layer comprises a metallic layer and/or a dielectric layer.

3. The method as claimed in claim 1,
wherein the carrier contains a semiconductor material.

4. The method as claimed in claim 1,
wherein the functional layer is arranged between the semiconductor layer sequence and the carrier.

5. The method as claimed in claim 1,
wherein the functional layer extends over a whole area of the composite assembly before severing the functional layer.

6. The method as claimed in claim 1,
wherein the chemical method comprises fluorocarbon having at least one of octafluorocyclobutane, tetrafluoromethane, and combinations thereof; wherein the protective layer further comprises the fluorocarbon.

7. The method as claimed in claim 1,
wherein the separating trenches extend completely through the carrier after forming separating trenches.

8. The method as claimed in claim 1,
wherein forming separating trenches in the carrier along the singulation pattern is carried out after severing the functional layer by means of coherent radiation.

9. The method as claimed in claim 1,
wherein the composite assembly is secured on an auxiliary carrier before singulation and the semiconductor chips are present in a geometrical order on the auxiliary carrier after singulation.

10. A semiconductor chip comprising:
a semiconductor body, a carrier body, and a functional layer, which are arranged one on top of another in a vertical direction; and
a protective layer comprising slag, wherein the slag is formed along at least one side of the functional layer and along at least one side of the carrier body by a removal of a material by means of coherent radiation; and
wherein the functional layer is covered by the protective layer.

11. The semiconductor chip as claimed in claim 10,
wherein the functional layer is arranged between the carrier body and the semiconductor body.

12. A semiconductor chip comprising:
a semiconductor body, a carrier body, and a functional layer arranged between the carrier body and the semiconductor body;
a protective layer comprising slag, wherein the slag is formed along at least one side of the functional layer and along at least one side of the carrier body by a removal of a material by means of coherent radiation; wherein the functional layer on the at least one side surface of the semiconductor chip which has the traces is covered by the protective layer; and
wherein at least a portion of the semiconductor body extends completely through the protective layer.

13. The method of claim 1, wherein the applying the protective layer occurs in the absence of a further etching step.

14. The semiconductor device of claim 12, further comprising:
an auxiliary carrier arranged under the carrier body; and
a further functional layer arranged between the carrier body and the auxiliary carrier.

* * * * *